(12) United States Patent
Lee et al.

(10) Patent No.: US 8,900,662 B2
(45) Date of Patent: Dec. 2, 2014

(54) THIN FILM DEPOSITING APPARATUS AND THIN FILM DEPOSITING METHOD USED BY THE SAME

(75) Inventors: Sung-Yong Lee, Yongin (KR); Myung-Soo Huh, Yongin (KR); Choel-Min Jang, Yongin (KR); Cheol-Rae Jo, Yongin (KR); In-Kyo Kim, Yongin (KR); Yong-Suk Lee, Yongin (KR); Mi-Ra An, Yongin (KR); Sang-Joon Seo, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 166 days.

(21) Appl. No.: 13/572,420

(22) Filed: Aug. 10, 2012

(65) Prior Publication Data
US 2013/0251902 A1   Sep. 26, 2013

(30) Foreign Application Priority Data

Mar. 20, 2012  (KR) .................. 10-2012-0028390

(51) Int. Cl.
*C23C 16/00*  (2006.01)
*C23C 16/44*  (2006.01)

(52) U.S. Cl.
USPC ............... 427/248.1; 118/715; 156/345.1; 156/345.33; 156/345.34

(58) Field of Classification Search
None
See application file for complete search history.

(56) References Cited

U.S. PATENT DOCUMENTS

2010/0227060 A1   9/2010  Na et al.

FOREIGN PATENT DOCUMENTS

| JP | 2007-126698 | 5/2007 |
| JP | 2008-231446 | 10/2008 |
| KR | 10-2010-0099917 | 9/2010 |

OTHER PUBLICATIONS

Miyazawa, JP2008-231446, Feb. 2008; Eng Mach Translation.*

* cited by examiner

*Primary Examiner* — Joseph Miller, Jr.
(74) *Attorney, Agent, or Firm* — Robert E. Bushnell, Esq.

(57) ABSTRACT

A thin film depositing apparatus and a thin film depositing method used by the thin film depositing apparatus. The thin film depositing apparatus includes a deposition chamber through which a process gas outlet of a deposition source is arranged; a transfer shuttle disposed in the deposition chamber, the transfer shuttle comprising a mounting plate for loading a substrate, the transfer shuttle being reciprocal with respect to the process gas outlet; and at least one bendable auxiliary plate installed at one side of the transfer shuttle, the bendable auxiliary plate closing the process gas outlet when opposite the process gas outlet, the bendable auxiliary plate comprising a folding member for placing the bendable auxiliary plate in each of an unbent state and bent state dependent upon the position of the transfer shuttle.

12 Claims, 5 Drawing Sheets

THIN FILM DEPOSITING APPARATUS AND THIN FILM DEPOSITING METHOD USED BY THE SAME

CLAIM OF PRIORITY

This application makes reference to, incorporates the same herein, and claims all benefits accruing under 35 U.S.C. §119 from an application earlier filed in the Korean Intellectual Property Office on the 20 Mar. 2012 and there duly assigned Serial. No. 10-2012-0028390.

BACKGROUND OF THE INVENTION

1. Field of the Invention

One or more embodiments of the present invention relate to a thin film depositing apparatus for generating a process gas of a deposition source and depositing the process gas on a surface of a substrate, and more particularly, to a thin film depositing apparatus for performing a deposition process by reciprocating with respect to a deposition source and a thin film depositing method used by the thin film depositing apparatus.

2. Description of the Related Art

A deposition process whereby a process gas generated from a deposition source is deposited on a surface of a substrate is widely used in a thin film manufacturing process, such as a thin film transistor manufacturing process of an organic light-emitting display device.

Recently, an atomic layer deposition (ALD) process, whereby a thin film may be more uniformly and precisely formed, has been preferred. In such an ALD process, deposition is repeatedly performed at the same location on a substrate more than 300 times.

Thus, to perform such a repetitive deposition process, a scan-type deposition process where a substrate is mounted on a transfer shuttle in a deposition chamber and reciprocates with respect to a deposition source is used.

In general, auxiliary plates having the same size as that of a mounting unit for the substrate are attached to the front and rear parts of the transfer shuttle. The auxiliary plates alternately close a process gas outlet whenever the substrate passes the process gas outlet of the deposition source, which is positioned in the deposition chamber. For example, when the substrate mounted on the transfer shuttle is transferred in one direction, the auxiliary plate at the front part of the transfer shuttle closes the process gas outlet before the substrate enters the process gas outlet of the deposition source, and then, after the substrate passes the process gas outlet, the auxiliary plate at the rear part of the transfer shuttle closes the process gas outlet. That is, the auxiliary plate at the front part of the transfer shuttle, a mounting plate of the transfer shuttle, and the auxiliary plate at the rear part of the transfer shuttle are alternately positioned in front of the process gas outlet of the deposition source, by reciprocating across the front of the process gas outlet.

As described above, the process gas outlet is alternately closed by the auxiliary plates. This is because a state of a process gas of the deposition source is maintained constant while a deposition process is performed. If the auxiliary plates are not used, the process gas outlet is in a completely opened state before and after the transfer shuttle passes the process gas outlet, and thus, the inside of the deposition chamber may be severely contaminated by the process gas of the deposition source. To prevent such a contamination, a separate shutter can be installed at the deposition source so that a process gas is discharged only when a substrate on the transfer shuttle passes the process gas outlet, which leads to less contamination to surroundings. However, a state of the process gas discharged from the process gas outlet is not maintained constant, and thus, this cannot ensure a uniform deposition quality. Therefore, the auxiliary plates are installed at the transfer shuttle so as to constantly discharge the process gas of the deposition source and alternately close the process gas outlet.

However, when the auxiliary plates are installed at the front and rear parts of the mounting plate of the transfer shuttle, the size of a deposition chamber needs to be increased corresponding to the size of the auxiliary plates. That is, since the auxiliary plates having almost the same size as that of the mounting plate are installed at the front and rear parts of the transfer shuttle, a sufficient space for a reciprocating operation needs to be secured, considering the sizes of the transfer shuttle and the auxiliary plates, and the size of the deposition chamber also needs to be increased corresponding thereto.

Therefore, there is a need to develop a method of effectively decreasing the size of a deposition chamber by using auxiliary plates.

SUMMARY OF THE INVENTION

One or more embodiments of the present invention provide a thin film depositing apparatus that uses auxiliary plates for alternately closing a process gas outlet of a deposition source and has an improved structure for the miniaturization of a deposition chamber, and a thin film deposition method using the thin film depositing apparatus.

According to an aspect of the present invention, there is provided a thin film depositing apparatus including a deposition chamber through which a process gas outlet of a deposition source is arranged; a transfer shuttle disposed in the deposition chamber, the transfer shuttle comprising a mounting plate for loading a substrate, the transfer shuttle being reciprocal with respect to the process gas outlet; and at least one bendable auxiliary plate installed at one side of the transfer shuttle, the bendable auxiliary plate closing the process gas outlet when opposite the process gas outlet, the bendable auxiliary plate comprising a folding member for placing the bendable auxiliary plate in each of an unbent state and bent state dependent upon the position of the transfer shuttle.

The bendable auxiliary plate may have a main body part attached to the one side of the transfer shuttle and an end part, wherein the folding member may include a hinge shaft rotatably connecting the end part to a main body part of the auxiliary plate, and an actuator rotating the end part with respect to the hinge shaft, the actuator performing a bending and unbending operation of the bendable auxiliary plate.

The apparatus may further include another auxiliary plate installed at an opposite side of the transfer shuttle, the another auxiliary plate closing the process gas outlet when opposite the process gas outlet.

The another auxiliary plate may be unbendable.

The another auxiliary plate may be bendable and include a corresponding folding member.

The end part of the bendable auxiliary plate may be disposed alongside a corresponding sidewall of the deposition chamber when the another auxiliary plate is disposed opposite the process gas outlet.

Each of the auxiliary plates may bent to dispose the corresponding end parts alongside a corresponding sidewall of the deposition chamber when the other of the auxiliary plates is unbent and disposed opposite the process gas.

The bendable auxiliary plate may be unbent while the transfer shuttle is reciprocated with respect to the process gas outlet, while the end part of the bendable auxiliary plate may be disposed alongside a corresponding sidewall of the deposition chamber when the process gas outlet is not closed and the transfer shuttle is stationary.

According to another aspect of the present invention, there is provided a thin film depositing method including: loading a substrate on a mounting plate attached to a transfer shuttle disposed within a deposition chamber, the transfer shuttle being reciprocal with respect to a process gas outlet and having first and second auxiliary plates installed on opposite sides of the mounting plate, the first auxiliary plate being in an unbent state closing the process gas outlet and the second auxiliary plate being in a bent state, when loading the substrate; moving the transfer shuttle across the process gas outlet to perform a deposition process; unbending the second auxiliary plate when moving the transfer shuttle across the process gas outlet in a first direction and closing the process gas outlet with the second auxiliary plate when the transfer shuttle moves passed the process gas outlet; and bending the second auxiliary plate when moving the transfer shuttle across the process gas outlet in a second direction opposite the first direction.

The depositing method may include bending the first auxiliary plate when moving the transfer shuttle past the process gas outlet in the first direction, and unbending the first auxiliary plate when moving the transfer shuttle across the process gas outlet in the second direction.

According to another aspect of the present invention, there is provided a thin film depositing method including: loading a substrate on a mounting plate attached to a transfer shuttle disposed within a deposition chamber in a loading position, the transfer shuttle being reciprocal with respect to a process gas outlet and having first and second auxiliary plates installed on opposite sides of the mounting plate, the first auxiliary plate being in an unbent state and the second auxiliary plate being in a bent state, when loading the substrate; moving the transfer shuttle in a first direction; closing the process gas outlet with the first auxiliary plate and unbending the second auxiliary plate, while moving the transfer shuttle in the first direction; forming a deposition process on the substrate when the transfer shuttle crosses the process gas outlet while moving in the first direction; closing the process gas outlet with the second auxiliary plate when the transfer shuttle passes the process gas outlet in the first direction; moving the transfer shuttle in a second direction opposite the first direction; forming a deposition process on the substrate when the transfer shuttle crosses the process gas outlet while moving in the second direction; and closing the process gas outlet with the first auxiliary plate when the transfer shuttle passes the process gas outlet in the second direction.

The depositing method may include repeatedly moving the transfer shuttle in the first and second directions until the deposition process is completed, and bending the second auxiliary plate while moving the transfer shuttle to the loading position.

According to the thin film depositing apparatus and the thin film depositing method, the auxiliary plate suitable for use in constantly maintaining a state of a process gas of a deposition source may be used, and, thanks to the use of the auxiliary plate, a burden of increasing the size of the deposition chamber may be alleviated.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Hereinafter, exemplary embodiments of the present invention will be described in detail with reference to the accompanying drawings.

First, a thin film depositing apparatus according to an embodiment of the present invention will now be described with reference to FIGS. 1A through 1C.

Figure 1A:
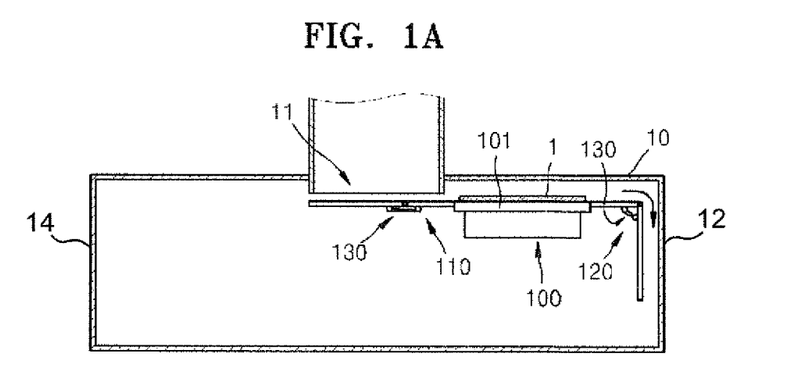
FIGS. 1A through 1C are diagrams illustrating a structure and a sequential operation of a thin film depositing apparatus according to an embodiment of the present invention.
Figure 1B:
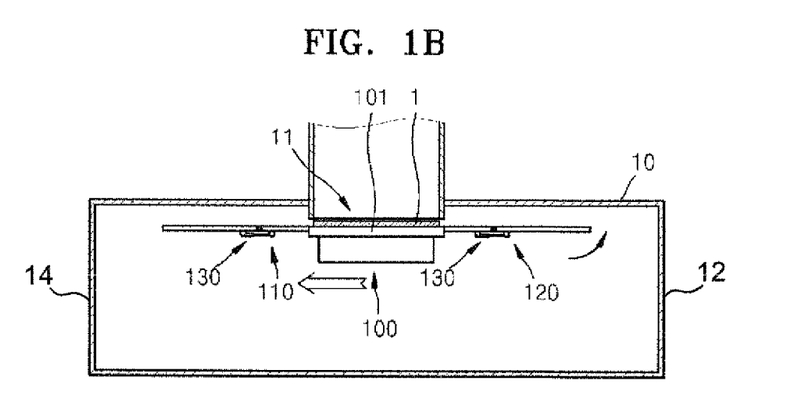
Figure 1C:
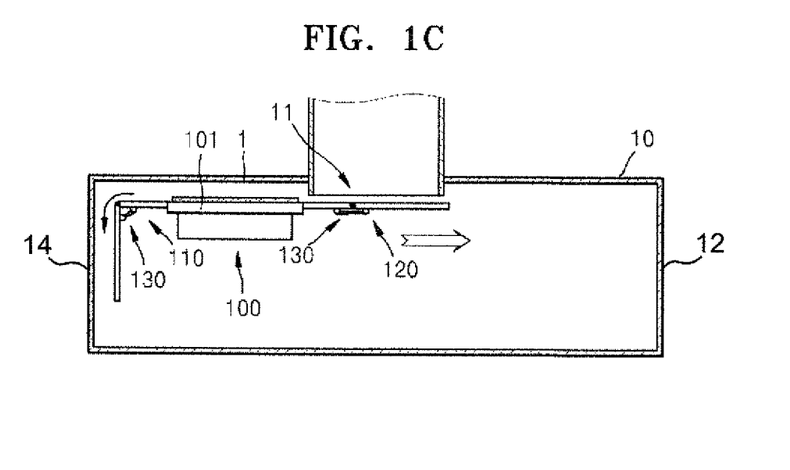

Referring to FIGS. 1A through 1C, the thin film depositing apparatus includes a deposition chamber 10 including a process gas outlet 11 through which a process gas of a deposition source is discharged and a transfer shuttle 100 for mounting a substrate 1 which reciprocates across the front of the process gas outlet 11 and then passes the process gas outlet 11.

The transfer shuttle 100 on which the substrate 1 is mounted on a mounting plate 101 reciprocates at a position where the substrate 1 and the process gas outlet 11 face each other and passes the process gas outlet 11, and deposition is performed on the substrate 1 through the process gas outlet 11.

The transfer shuttle 100 includes an auxiliary plate 110 and an auxiliary plate 120 that are installed at the front and rear sides of the transfer shuttle 100. The auxiliary plates 110 and 120 screen the process gas outlet 11. If the process gas outlet 11 is completely in an opened state after the substrate 1 on the mounting plate 101 passes the process gas outlet 11, the inside of the deposition chamber 10 is severely contaminated. Thus, to prevent contamination, the auxiliary plates 110 and 120 at the front and rear sides of the transfer shuttle 100 alternately screen the process gas outlet 11.

As illustrated in FIGS. 1A through 1C, the auxiliary plates 110 and 120 each include a folding member 130 that performs a bending or unbending operation. In other words, the folding member 130 is unbent at a position where the process gas outlet 11 is screened, and the folding member 130 is bent at a position adjacent to side walls 12 or 14 of the deposition chamber 10. Accordingly, the auxiliary plates 110 and 120 are bent whenever approaching the side walls 12 or 14 of the deposition chamber 10, resulting in a decrease in a length of each of the auxiliary plates 110 and 120, whereby a space of the deposition chamber 10 may be minimized. If each of the auxiliary plates 110 and 120 does not include the folding member 130, a space where the auxiliary plates 110 and 120 are transferred in a completely unbent state needs to be secured, and thus, the size of the deposition chamber 10 needs to be increased corresponding to the secured space. In this embodiment, however, the auxiliary plates 110 and 120 may be bendable so that the space of the deposition chamber 10 may be decreased.

Figure 2A:
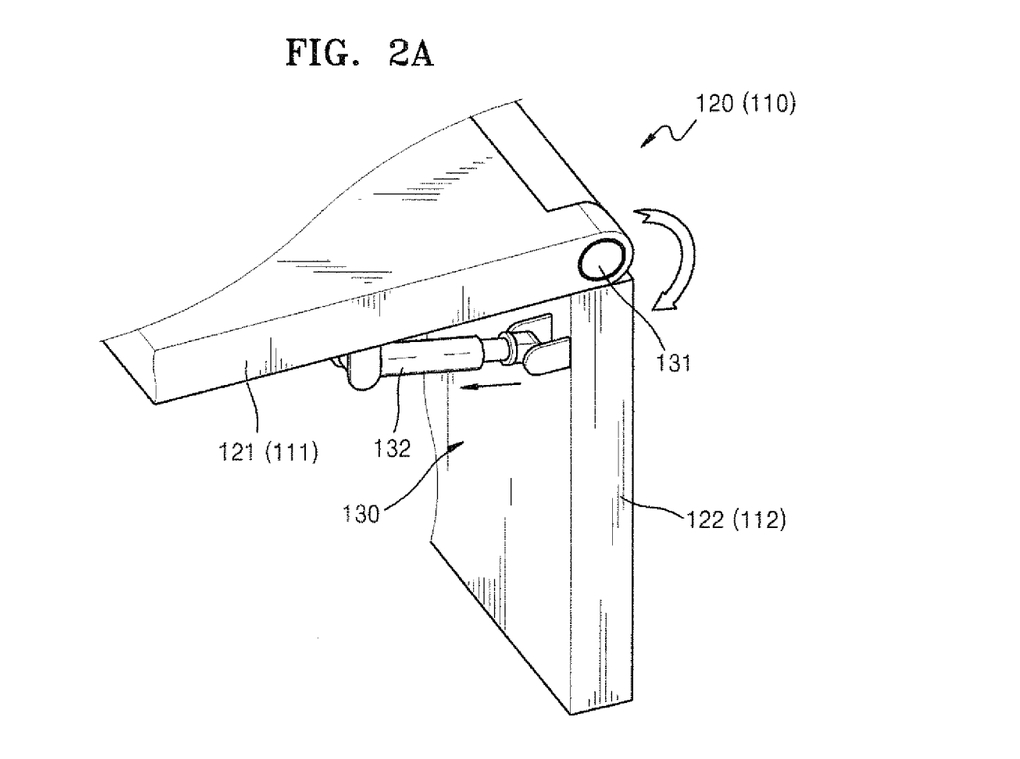
FIGS. 2A and 2B are diagrams sequentially illustrating an operation of an auxiliary plate of the thin film depositing apparatus illustrated in FIGS. 1A through 1C, according to embodiments of the present invention.
Figure 2B:
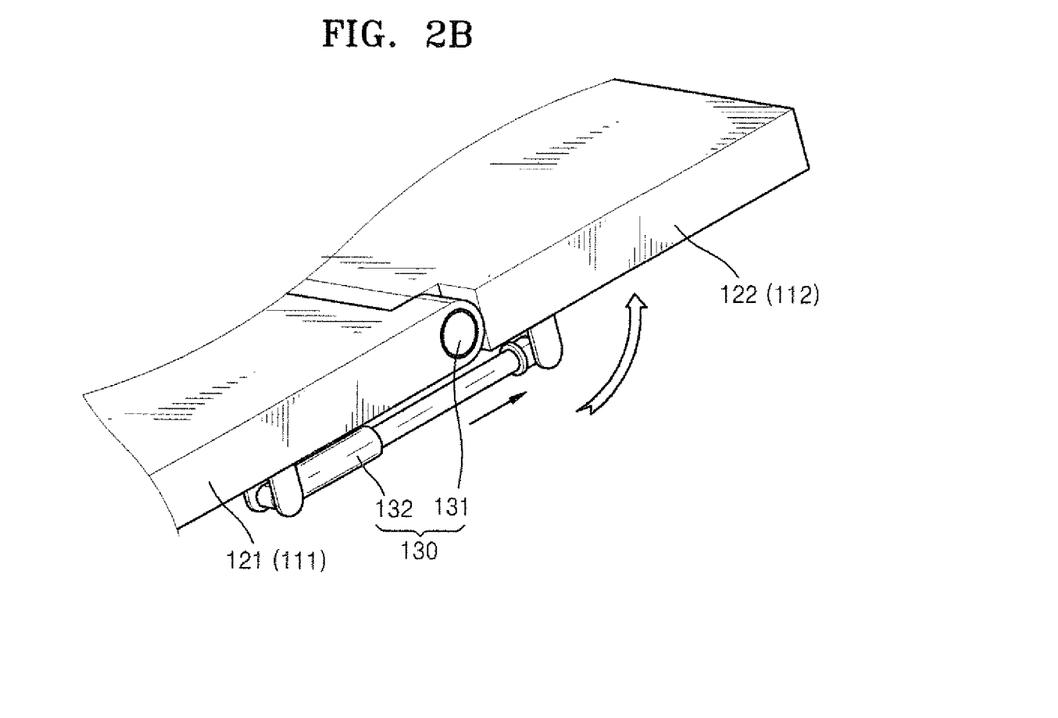

The folding member 130 may be configured as illustrated in FIGS. 2A and 2B. Referring to FIGS. 2A and 2B, the auxiliary plate 120 is illustrated, and the auxiliary plate 110 also has the same structure as that of the auxiliary plate 120.

The auxiliary plate 120 includes a main body part 121 fixed to the transfer shuttle 100 (not shown) and an end part 122 that is rotatably connected to the main body part 121 with respect to a hinge shaft 131. An actuator 132 is installed to connect the main body part 121 and the end part 122 and may be, for example, an air cylinder. In this regard, when the actuator 132 contracts, as illustrated, in FIG. 2A, the end part 122 is bent by 90 degrees with respect to the main body part 121, thereby decreasing the length of the auxiliary plate 120 in a proceeding direction thereof. On the other hand, when the actuator 132 expands, as illustrated in FIG. 2B, the end part 122 is unbent and lies in parallel with the main body part 121.

The thin film depositing apparatus, including the bendable-type auxiliary plates 110 and 120 may operate as follows.

First, the substrate 1 on which deposition is to be performed is mounted on the mounting plate 101 of the transfer shuttle 100. The mounting of the substrate 1 is generally performed using a robot arm (not shown).

Subsequently, when the mounting of the substrate 1 is completed, a deposition process is initiated with a reciprocating operation of the transfer shuttle 100. At this time, a process gas of a deposition source is constantly discharged through the process gas outlet 11. In this regard, as illustrated in FIG. 1A, when the transfer shuttle 100 is transferred in a right direction, the auxiliary plate 110 is in a unbent state and closes the process gas outlet 11, and the auxiliary plate 120 is bent to be adjacent to a side wall 12 of the deposition chamber 10 so that the length of the auxiliary plate 120 is decreased.

As illustrated in FIG. 1B, when the transfer shuttle 100 is transferred in a left direction from this state, the mounting plate 101 of the transfer shuttle 100 faces the process gas outlet 11 and then a deposition process starts being performed on the substrate 1. Meanwhile, the auxiliary plate 120 is unbent and prepares to close the process gas outlet 11.

Subsequently, as illustrated in FIG. 1C, when the transfer shuttle 100 is transferred further in a left direction, the auxiliary plate 120 that has unbent closes the process gas outlet 11, and the auxiliary plate 110 is bent to be adjacent to an opposite side wall 14 of the deposition chamber 10.

A transfer of the transfer shuttle 100 in an inverse direction is performed in an inverse order to that described above. When an atomic layer deposition (ALD) process, which has been recently used, is performed, such a reciprocating operation is repeatedly performed hundreds of times.

Therefore, according to this embodiment, the auxiliary plates 110 and 120 that alternately close the process gas outlet 11 have a bendable function, and thus, the size of the deposition chamber 10 may be smaller than that of a conventional fixed-type deposition chamber. In other words, the deposition chamber 10 includes the auxiliary plates 110 and 120 and thus allows a process gas to be discharged from a deposition source, whereby the size of the deposition chamber 10 may be decreased.

Figure 3A:
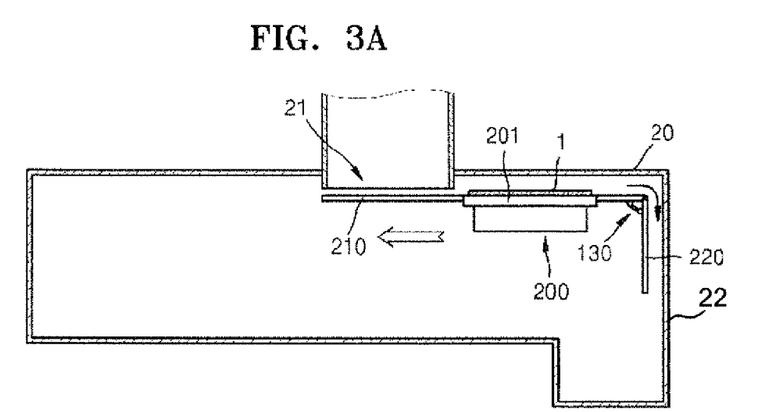
FIGS. 3A through 3C are diagrams illustrating a structure and a sequential operation of a thin film depositing apparatus according to another embodiment of the present invention.
Figure 3B:
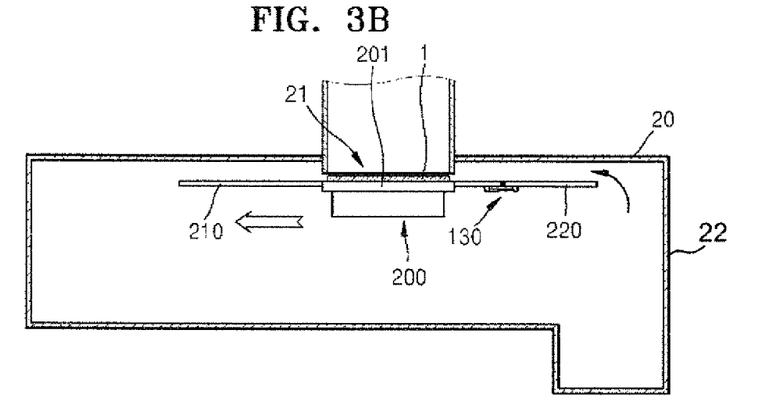
Figure 3C:
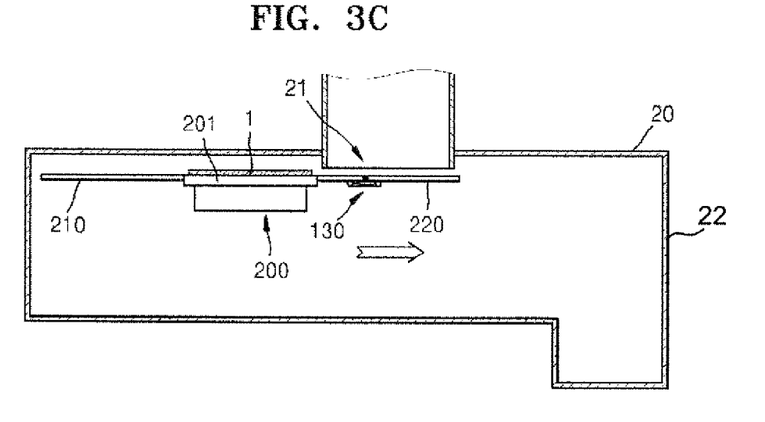

FIGS. 3A through 3C are diagrams illustrating a structure and a sequential operation of a thin film depositing apparatus according to another embodiment of the present invention.

In the previous embodiments, the auxiliary plates 110 and 120 are of a bendable type. In this embodiment, however, an auxiliary plate 220 is a bendable type and an auxiliary plate 210 is of a fixed type. That is, as the number of driving elements increases, a breakdown may frequently occur, and thus, only the auxiliary plate 220 is configured to be of a bendable type, whereby the size of a deposition chamber 20 is decreased and the number of driving elements is also decreased accordingly. The folding member 130 of the auxiliary plate 220 may have the same structure as that of the folding member 130 of the auxiliary plate 120 illustrated in FIGS. 2A and 2B.

The thin film depositing apparatus including the fixed-type auxiliary plate 210 and the bendable-type auxiliary plate 220 may operate as follows.

First, a substrate 1 on which deposition is to be performed is mounted on a mounting plate 201 of a transfer shuttle 200. The mounting of the substrate 1 is generally performed using a robot arm (not shown).

Subsequently, when the mounting of the substrate 1 is completed, a deposition process is initiated with a reciprocating operation of the transfer shuttle 200. At this time, a process gas of a deposition source is constantly discharged through a process gas outlet 21. In this regard, as illustrated in FIG. 3A, when the transfer shuttle 200 is transferred in a right direction, the auxiliary plate 210 closes the process gas outlet 21, and the auxiliary plate 220 positioned adjacent to a side wall 22 of the deposition chamber 20 is bent so that the length of the auxiliary plate 220 is decreased.

As illustrated in FIG. 3B, when the transfer shuttle 200 is transferred in a left direction from this state, the mounting plate 201 of the transfer shuttle 200 faces the process gas outlet 21 and a deposition process starts being performed on the substrate 1. Meanwhile, the auxiliary plate 220 is unbent and prepares to close the process gas outlet 21.

Subsequently, as illustrated in FIG. 3C, when the transfer shuttle 200 is transferred further in a left direction, the auxiliary plate 220 that has unbent closes the process gas outlet 21.

A transfer of the transfer shuttle 200 in an inverse direction is performed in an inverse order to that described above.

Therefore, according to this embodiment, the auxiliary plate 220 has a bendable function, and thus, the size of the deposition chamber 20 may be decreased. In addition, the auxiliary plate 210 is of a fixed type, and thus, the number of driving elements may also be appropriately decreased.

FIGS. 4A through 4D are diagrams illustrating a structure and a sequential operation of a thin film depositing apparatus according to another embodiment of the present invention.

As in the previous embodiment, in this embodiment, only an auxiliary plate 320 is of a bendable type, and an auxiliary plate 310 is of a fixed type. A folding member 130 of the auxiliary plate 320 may have the same structure as that of the folding member 130 of the auxiliary plate 120 illustrated in FIGS. 2A and 2B.

In this embodiment, a bendable operation of the auxiliary plate 320 is not performed during a reciprocating process for deposition, but, when a transfer shuttle 300 is transferred to a loading position for loading or unloading a substrate 1 on or from a mounting plate 301, the auxiliary plate 320 is bent.

That is, if desired, as illustrated in FIGS. 4A through 4D, a deposition chamber 30 in which the loading position for loading or unloading the substrate 1 is further arranged at an outer side of a reciprocating position may be used.

In this embodiment, the auxiliary plate 320 is bent adjacent to a side wall 32 of the deposition chamber 30 only at the loading position so as to decrease the length thereof, and the auxiliary plate 320 is in a continuously unbent state during a reciprocating process for deposition. This is because the reciprocating process is repeatedly performed hundreds of times in a deposition process such as ALD, and thus, if the auxiliary plate 320 is bent or unbent whenever the reciprocating process is performed, this may be a burden on the folding member 130.

Therefore, the auxiliary plates 310 and 320 are in a completely unbent state while being transferred, and the auxiliary plate 320 is bent only at the loading position, which contributes to decreasing the size of the deposition chamber 30 to some extent, as compared to a case where both the auxiliary plates 310 and 320 are of a fixed type.

Figure 4A:
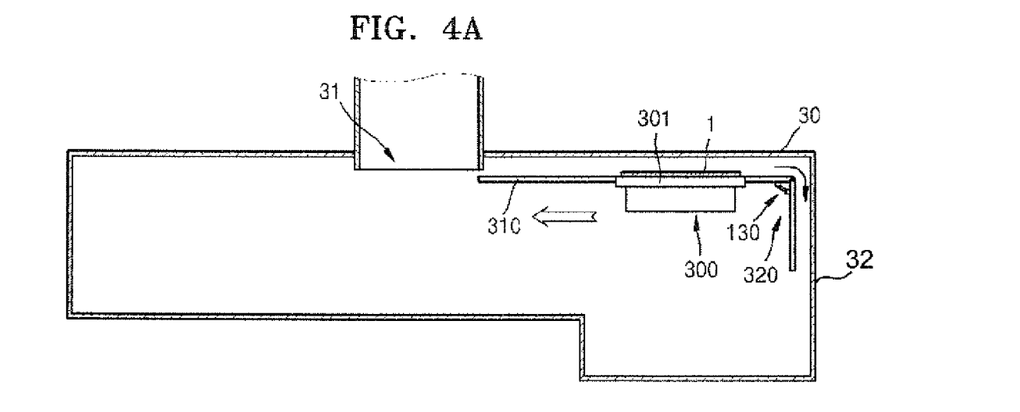
FIGS. 4A through 4D are diagrams illustrating a structure and a sequential operation of a thin film depositing apparatus according to another embodiment of the present invention.

The thin film depositing apparatus including the deposition chamber 30 that further secures the loading position may operate as follows:

First, as illustrated in FIG. 4A, the transfer shuttle 300 is transferred to the loading position and a substrate 1 on which deposition is to be performed is mounted on a mounting plate 301. The mounting of the substrate 1 is generally performed using a robot arm (not shown). In this regard, the auxiliary plate 320 is in a bent state adjacent to the side wall 32 of the deposition chamber 30.

Figure 4B:
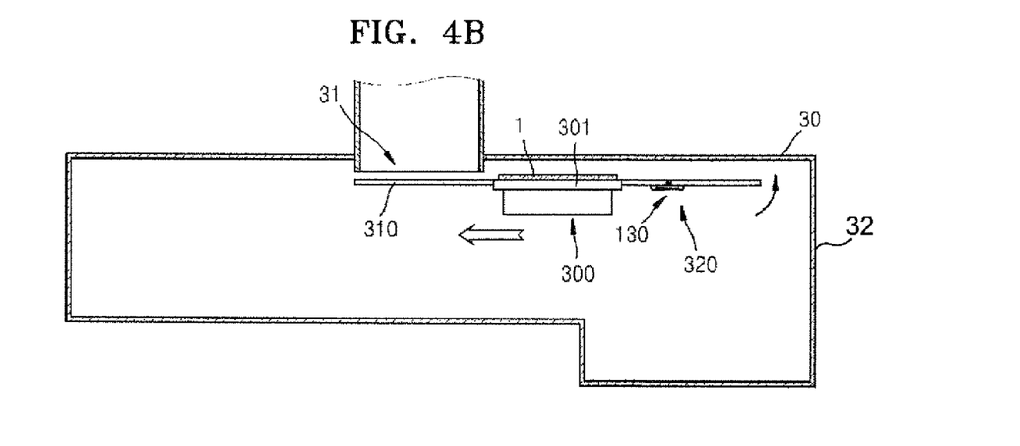

Subsequently, when the mounting of the substrate 1 is completed, a deposition process is initiated with a reciprocating operation of the transfer shuttle 300. At this time, a process gas of a deposition source is constantly discharged through a process gas outlet 31. In this regard, as illustrated in FIG. 4B, when the transfer shuttle 300 lies on the right side of the process gas outlet 31, the auxiliary plate 310, which is of a fixed type, closes the process gas outlet 11, and the auxiliary plate 320, which is of a bendable type, is in a continuously unbent state during the reciprocating process.

Figure 4C:
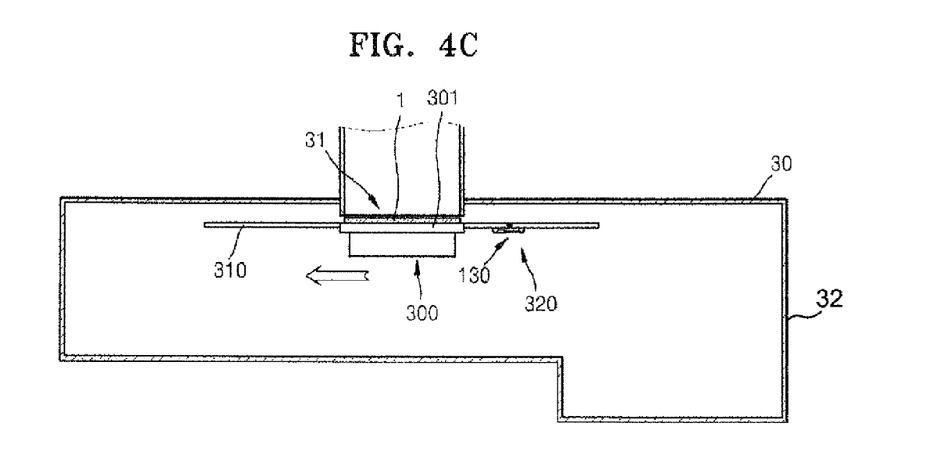

As illustrated in FIG. 4C, when the transfer shuttle 300 is transferred in a left direction from this state, the mounting plate 301 of the transfer shuttle 300 faces the process gas outlet 31 and the deposition process is then performed on the substrate 1.

Figure 4D:
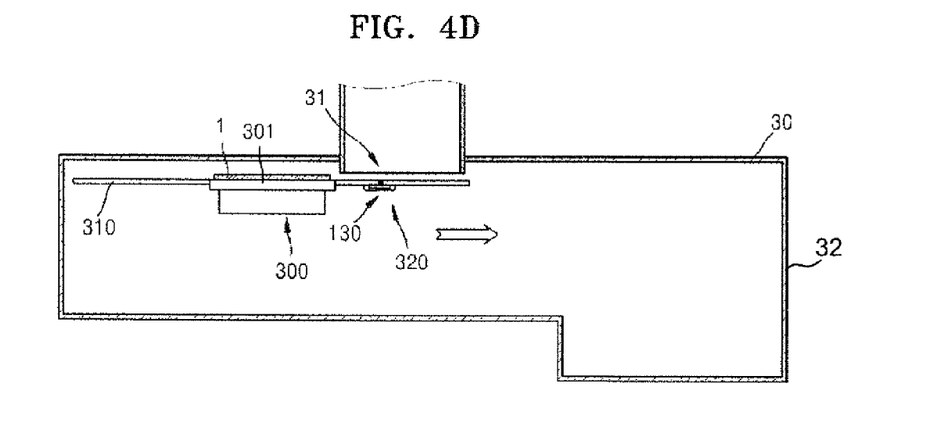

Subsequently, as illustrated in FIG. 4D, when the transfer shuttle 300 is transferred further in a left direction, the auxiliary plate 320 closes the process gas outlet 31.

A transfer of the transfer shuttle 300 in an inverse direction is performed in an inverse order to that described above.

Therefore, according to the present embodiment, the auxiliary plate 320 is bent at the loading position, and thus, the size of the deposition chamber 30 may be decreased. In addition, both the auxiliary plates 310 and 320 are in an unbent state during the reciprocating process, and thus, there is a decreasing probability of a breakdown due to a frequent bending operation.

As described above, according to the one or more embodiments of the present invention, a thin film depositing apparatus includes an auxiliary plate suitable for use in constantly maintaining a state of a process gas of a deposition source, whereby a burden of increasing the size of a deposition chamber may be appropriately alleviated.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A thin film depositing apparatus comprising:
a deposition chamber through which a process gas outlet of a deposition source is arranged;
a transfer shuttle disposed in the deposition chamber, the transfer shuttle comprising a mounting plate for loading a substrate, the transfer shuttle being reciprocal with respect to the process gas outlet; and
at least one bendable auxiliary plate installed at one side of the transfer shuttle, the bendable auxiliary plate closing the process gas outlet when opposite the process gas outlet, the bendable auxiliary plate comprising a folding member for placing the bendable auxiliary plate in each of an unbent state and bent state dependent upon the position of the transfer shuttle.

2. The thin film depositing apparatus of claim 1, the bendable auxiliary plate having a main body part attached to the one side of the transfer shuttle and an end part, the folding member comprising:
a hinge shaft rotatably connecting the end part to a main body part of the auxiliary plate; and
an actuator rotating the end part with respect to the hinge shaft, the actuator performing a bending and unbending operation of the bendable auxiliary plate.

3. The thin film depositing apparatus of claim 2, further comprising another auxiliary plate installed at an opposite side of the transfer shuttle, the another auxiliary plate closing the process gas outlet when opposite the process gas outlet.

4. The thin film depositing apparatus of claim 3, the another auxiliary plate being unbendable.

5. The thin film depositing apparatus of claim 3, the another auxiliary plate being bendable and comprising a corresponding folding member.

6. The thin film depositing apparatus of claim 4, the end part of the bendable auxiliary plate being disposed alongside a corresponding sidewall of the deposition chamber when the another auxiliary plate is disposed opposite the process gas outlet.

7. The thin film depositing apparatus of claim 5, each of the auxiliary plates being bent to dispose the corresponding end parts alongside a corresponding sidewall of the deposition chamber when the other of the auxiliary plates is unbent and disposed opposite the process gas outlet.

8. The thin film depositing apparatus of claim 4, the bendable auxiliary plate being unbent while the transfer shuttle is reciprocated with respect to the process gas outlet, the end part of the bendable auxiliary plate being disposed alongside a corresponding sidewall of the deposition chamber when the process gas outlet is not closed and the transfer shuttle is stationary.

9. A thin film depositing method comprising:
loading a substrate on a mounting plate attached to a transfer shuttle disposed within a deposition chamber, the transfer shuttle being reciprocal with respect to a process gas outlet and having first and second auxiliary plates installed on opposite sides of the mounting plate, the first auxiliary plate being in an unbent state closing the process gas outlet and the second auxiliary plate being in a bent state, when loading the substrate;
moving the transfer shuttle across the process gas outlet to perform a deposition process;
unbending the second auxiliary plate when moving the transfer shuttle across the process gas outlet in a first direction and closing the process gas outlet with the second auxiliary plate when the transfer shuttle moves passed the process gas outlet; and bending the second auxiliary plate when moving the transfer shuttle across the process gas outlet in a second direction opposite the first direction.

10. The thin film depositing method of claim 9, further comprising:
bending the first auxiliary plate when moving the transfer shuttle past the process gas outlet in the first direction; and
unbending the first auxiliary plate when moving the transfer shuttle across the process gas outlet in the second direction.

11. A thin film depositing method comprising:
- loading a substrate on a mounting plate attached to a transfer shuttle disposed within a deposition chamber in a loading position, the transfer shuttle being reciprocal with respect to a process gas outlet and having first and second auxiliary plates installed on opposite sides of the mounting plate, the first auxiliary plate being in an unbent state and the second auxiliary plate being in a bent state, when loading the substrate;
- moving the transfer shuttle in a first direction;
- closing the process gas outlet with the first auxiliary plate and unbending the second auxiliary plate, while moving the transfer shuttle in the first direction;
- forming a deposition process on the substrate when the transfer shuttle crosses the process gas outlet while moving in the first direction;
- closing the process gas outlet with the second auxiliary plate when the transfer shuttle passes the process gas outlet in the first direction;
- moving the transfer shuttle in a second direction opposite the first direction;
- forming a deposition process on the substrate when the transfer shuttle crosses the process gas outlet while moving in the second direction; and
- closing the process gas outlet with the first auxiliary plate when the transfer shuttle passes the process gas outlet in the second direction.

12. The thin film depositing method of claim 11, further comprising:
- repeatedly moving the transfer shuttle in the first and second directions until the deposition process is completed; and
- bending the second auxiliary plate while moving the transfer shuttle to the loading position.

* * * * *